United States Patent [19]

Tanoi

[11] Patent Number: 4,996,447
[45] Date of Patent: Feb. 26, 1991

[54] FIELD-EFFECT TRANSISTOR LOAD CIRCUIT

[75] Inventor: Satoru Tanoi, Tokyo, Japan

[73] Assignee: Oki Electric Industry Co., Ltd., Tokyo, Japan

[21] Appl. No.: 568,521

[22] Filed: Aug. 13, 1990

Related U.S. Application Data

[63] Continuation of Ser. No. 285,522, Dec. 16, 1988, abandoned.

[30] Foreign Application Priority Data

Dec. 18, 1987 [JP] Japan .................. 62-320647

[51] Int. Cl.$^5$ ............... H03K 3/353; H03K 19/017
[52] U.S. Cl. ................. 307/304; 307/448; 307/450; 307/263; 307/264
[58] Field of Search ............ 307/304, 443, 448, 450, 307/451, 263, 264; 365/189

[56] References Cited

U.S. PATENT DOCUMENTS

| | | | |
|---|---|---|---|
| 4,195,356 | 3/1980 | O'Connell et al. | 307/238 |
| 4,516,225 | 5/1985 | Frederick | 307/304 |
| 4,521,698 | 6/1985 | Taylor | 307/450 |
| 4,656,372 | 4/1987 | Sani et al. | 307/473 |

FOREIGN PATENT DOCUMENTS

| | | |
|---|---|---|
| 2946803 | 6/1980 | Fed. Rep. of Germany . |
| 2641860 | 11/1982 | Fed. Rep. of Germany . |
| 3521480 | 12/1985 | Fed. Rep. of Germany . |
| 8713738 | 2/1988 | Fed. Rep. of Germany . |
| 59-221888 | 12/1984 | Japan . |

OTHER PUBLICATIONS

Copy of Certified Copy of U.S. application Ser. No. 641,797, filed Dec. 18, 1975 by Cranford et al.
Kagobutsu Handotai Debaisu II (Compound Semiconductor Devices II) first edition; by Imai, Ikoma, Sata, and Fujimoto, published Kogyo Chosakai on Jan. 10, 1985, pp. 6 to 9, and illustrated in FIG. 1.
IEEE Journal of Solid-State Circuits, vol. SC-22, No. 5, Oct, 1987; pp. 699-703; A GaAs 16K SRAM with a Single 1-V Supply; Satoshi Takano, et al.
1986 IEEE GaAs IC Symposium; pp. 93-96; "A High--Speed GaAs 256x4-Bit Ram"; Grung et al.
1985 IEEE GaAs ICC Symposium; pp. 207-210; "A Fully Operational 1Kb Hemt Static Ram"; Kobayashi et al.
IBM Technical Disclosure Bulletin, vol. 29, No. 7, Dec. 1986; Digital Driver with Mesfets Having Three Difference Threshold Voltages; pp. 2885-2886.
Solid-State Electronics, vol. 30, No. 4, 1987; GaAs Inverted Common Drain Logic (ICDL) and Its Performance Compared with Other GaAs Logic Families; Ibrahim M. Abdel-Motaleb et al.; pp. 403-405.

Primary Examiner—Stanley D. Miller
Assistant Examiner—M. R. Wambach
Attorney, Agent, or Firm—Wenderoth, Lind & Ponack

[57] ABSTRACT

A FET load circuit consists of two depletion-mode FETs connected in series. The gate of one FET is connected to ground. The gate of the other FET is connected to its source. This load circuit reduces power dissipation and provides superior operational stability, particularly in gallium-arsenide DCFL logic and memory circuits.

12 Claims, 4 Drawing Sheets

FIELD-EFFECT TRANSISTOR LOAD CIRCUIT

This application is a continuation of now abandoned application, Ser. No. 07/285,522 filed on Dec. 16, 1988.

BACKGROUND OF THE INVENTION

This invention relates to a field-effect transistor load circuit, and more particularly to a metal semiconductor field-effect transistor load circuit, for a circuit such as a gallium-arsenide integrated logic circuit or for the bit line of a gallium-arsenide integrated memory circuit.

Hereinafter a field-effect transistor will be referred to as an FET and a metal semiconductor field-effect transistor as an MESFET. The source electrode gate electrode, and drain electrode of an FET will be referred to as simply the source gate, and drain. An enhancement-mode FET, that is an FET which is normally in the off state, will be denoted an EFET. A depletion-mode FET, that is, an FET which is normally in the on state, will be denoted a DFET. The symbol Vdd will denote the supply voltage of the circuit under discussion, and Vss will denote the ground potential of 0V.

Due to their high operating speeds, integrated galliumarsenide logic and memory devices are coming into use in cache memories and peripheral logic devices for high-speed microprocessors, and in other digital applications in which speed is a critical factor. A circuit design that has been widely employed in these applications is the direct-coupled FET logic (DCFL) design described for example in the first edition of Kagobutsu Handotai Debaisu II (Compound Semiconductor Devices II) by Imai, Ikoma, Sato, and Fujimoto, published by Kogyo Chosakai on Jan. 10, 1985, pages 6 to 9, and illustrated in FIG. 1.

The device in FIG. 1 is an inverter logic circuit comprising an input terminal Vin 1, an output terminal Vout 2, and an EFET 3 that receives an input signal Vin from the input terminal 1 at its gate and provides the inverted signal from its source to the output terminal 2. The prior-art load circuit 10 connected to this logic circuit comprises a DFET 11, the gate and source electrodes of which are electrically coupled to each other and to the drain of the EFET 3. The drain of the EFET 3 and source of the DFET 11 are also coupled to Vss through a Schottky diode 20 that is present between the gate and channel of the next-stage logic transistor. This diode will hereinafter be referred to as a parasitic diode. The drain of the DFET 11 is connected to Vdd; the source of the EFET 3 is connected to Vss. The interconnection between the source and gate of the DFET 11 assures that the DFET 11 is always in the on state, permitting load current to flow.

The operating characteristics of this circuit are illustrated in FIG. 2, which shows the relationship between the load current 1 and the output signal voltage Vout. In FIG. 2. L denotes the load curve of the load circuit 10 in FIG. 1. Cl denotes the characteristic curve of the EFET 3 when the input signal Vin denotes at the High logic level. Ch is the characteristic curve of the EFET 3 when the input signal Vin denotes at the Low logic level, and Cd is the forward characteristic curve of the parasitic diode 20 in the next stage. When the input signal Vin is High, the circuit operates at the point of intersection Pl of the L and Cl curves, and the output signal Vout is at the Low potential V1, which is approximately 0.1V. When the input signal Vin changes from High to Low, the characteristic curve of the EFET 3 changes from Cl to Ch. If the output terminal Vout 2 were unconnected, the circuit would operate at the point Pha and the output voltage Vout would be close to Vdd. Because the circuit is connected to a next-stage DCFL logic circuit, however the output voltage cannot rise substantially above the forward turn-on voltage Vf of the next-stage parasitic diode 20, which thus clamps the output signal Vout to a value of approximately 0.6V to 0.8V. This accordingly becomes the High output logic level Vh, and the circuit operates at the point Ph. In the region between the Low and High output logic levels, the load DFET 11 saturates and operates as a constant-current source so the current flowing through the load circuit is clamped to a substantially constant value Icr.

The comparatively small DCFL logic swing of 0.5V to 0.7V and the extremely high electron mobility of gallium arsenide combine to enable circuits of the type illustrated in FIG. 1 to operate at high speeds. A problem is present with the circuit shown in FIG. 1, however, in that the relatively high current times voltage product at the point Ph causes an unnecessary amount of power to be dissipated in the High output state. A further problem is present in that if a load DFET 11 with a large current gain coefficient $\beta$ is employed to increase the driving power of the circuit the resulting large inflow of clamp current to the gate of the next-stage EFET creates a large voltage effect in the source resistance of this EFET. which raises the Low logic level of the next-stage circuit. Since the logic swing of the circuit is only 0.5V to 0.7V to begin with, elevation of the Low logic level seriously reduces the operating margin of the circuit and can lead to instability.

SUMMARY OF THE INVENTION

An object of this invention is accordingly to provide an FET load circuit in which the preceding problems of unnecessarily high power dissipation and unstable circuit operation are solved.

A field-effect transistor load circuit according to this invention comprises a first field-effect transistor of the normally-on type the gate and source electrodes of which are mutually interconnected, and a second field-effect transistor of the normally-on type, the gate electrode of which is connected to the circuit ground. The first field-effect transistor and second field effect transistor are connected in series between the circuit supply voltage and a node for interconnection to a driving circuit.

DETAILED DESCRIPTION OF THE EMBODIMENTS

Figure 1:
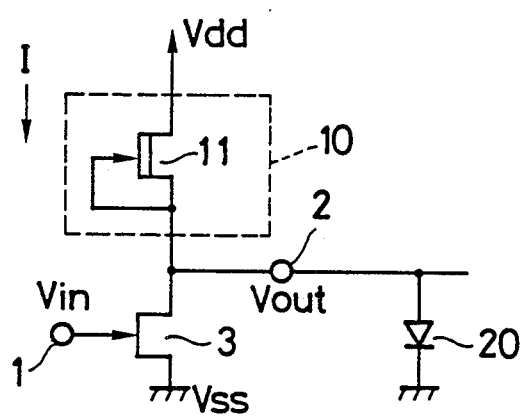
FIG. 1 is a schematic diagram illustrating a DCFL circuit with a prior-art load circuit.
Figure 2:
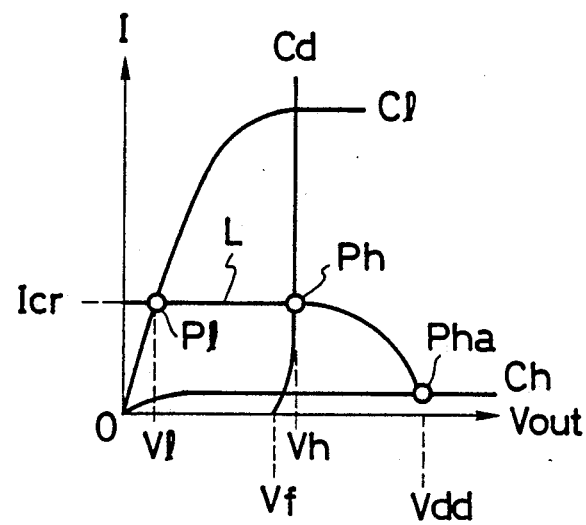
FIG. 2 is a graph illustrating the operating characteristics of the circuit shown in FIG. 1.
Figure 3:
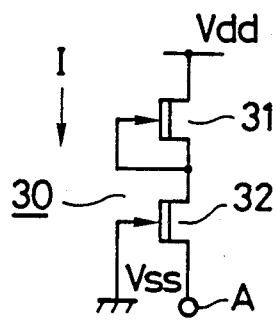
FIG. 3 is a schematic diagram of an FET load circuit illustrating an embodiment of the present invention.

FIG. 3 is a schematic diagram of a novel FET load circuit illustrating a first embodiment of the present invention. The novel FET load circuit comprises a pair of depletion-mode field-effect transistors: a DFET 31 (the first field-effect transistor) and a DFET 32 (the second field-effect transistor). The drain of the DFET 31 is connected to the supply voltage: its source and gate are connected to each other and to the drain of the DFET 32. The source of the DFET 32 is connected to a node A to which a driving circuit can be connected. The gate of the DFET 32 is connected to the ground potential Vss. The DFET 31 and DFET 32 are designed so that the absolute value |Vtd| of their threshold voltage Vtd is less than the supply voltage Vdd, and the DFET 31 has a smaller transistor gain coefficient $\beta$ than the DFET 32.

Figure 4:
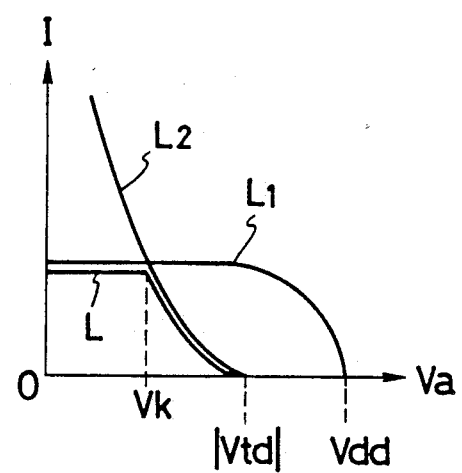
FIG. 4 is a graph illustrating the operating characteristics of the circuit shown in FIG. 3.

FIG. 4 is a load characteristic graph showing the relationship between the load current I and the potential Va at the node A. The curve L1 is the load characteristic of the DFET 31. The curve L2 is the load characteristic of the DFET 32. The curve L is the load characteristic of the entire load circuit 30.

When the node A is at the ground potential Vss the gate-source potential difference of both the DFET 31 and the DFET 32 is 0V. Since 0V > Vtd, both the DFET 31 and the DFET 32 are in the on state, permitting current to flow. Since the DFET 31 has a smaller gain $\beta$, however, it saturates at a lower level, so the current flowing through the load circuit is limited to the saturation level of the curve L1. As the potential of the node A begins to rise, the gate and source of the DFET 31 remain at the same potential and the DFET 31 remains in the saturated state; thus operating as a constant-current source and limiting the load current to a constant value represented by the flat portion of the curves L1 and L.

As the potential Va of the node A rises, the gate-source potential difference of the DFET 32 drops by a corresponding amount to a value less than 0V. Accordingly, the DFET 32 quickly unsaturates and its conductance begins to decrease as shown by the curve L2. When the potential Va exceeds a certain potential Vk which is considerably less than Vdd, the DFET 32 becomes the dominant factor limiting current flow, and the conductance of the load circuit begins to drop sharply along the curve L2. When the potential Va of the node A reaches the absolute value |Vtd| of the threshold voltage Vtd, current flow is entirely cut off.

Figure 5:
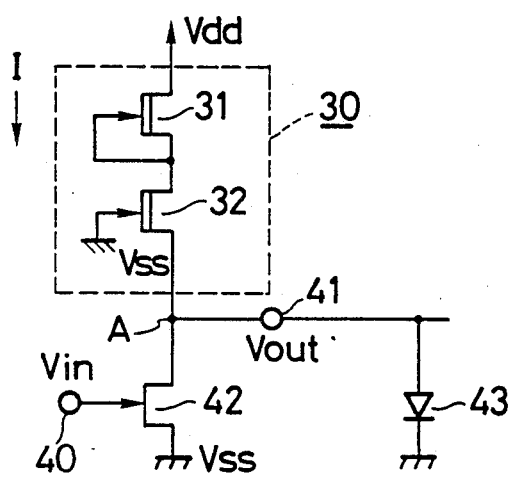
FIG. 5 is a schematic diagram of a logic circuit incorporating the FET load circuit shown in FIG. 3.

FIG. 5 is a schematic diagram illustrating an application of the load circuit 30 of the first embodiment in a logic circuit. This logic circuit operates as an inverter, comprising an input terminal 40 for an input signal Vin, an output terminal 41 for an output signal Vout, an EFET 42 as a driving element, and the load circuit 30 shown in FIG. 3. The drain of the EFET 42 is connected to the node A and to the output terminal 41, its gate is connected to the input terminal 40, and its source is connected to the ground potential Vss. The output terminal 41 is connected to a parasitic diode 43 which is present at the input of the next-stage logic circuit. In the load circuit 30, the threshold voltage Vtd of the DFETs 31 and 32 should be close in absolute value to Vf, the turn-on voltage of the parasitic diode 43: |Vtd| = Vf (<<Vdd). Preferably, the DFETs 31 and 32 should be designed so that their threshold voltage Vtd is substantially in the range from −0.7V to −0.8V.

Figure 6:
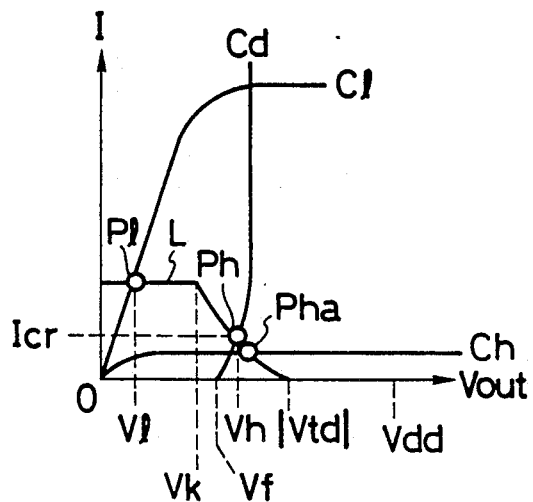
FIG. 6 is a graph illustrating the operating characteristics of the circuit shown in FIG. 5.

FIG. 6 is a graph illustrating the operating characteristics of the circuit shown in FIG. 5 by showing the relationship between the output voltage Vout and the load current I. The curve L is the load curve of the load circuit 30. The curve Cl is the characteristic curve of the EFET 42 when the input signal Vin is at the High logic level. The curve Ch is the characteristic curve of the EFET 42 when the input signal Vin is at the Low logic level. The curve Cd is the forward characteristic curve of the diode 43.

When the input signal Vin is High, the circuit operates at the point Pl where the curve Cl intersects the curve L, and the output signal Vout is at the Low logic level Vl. At this output level the DFET 31 in the load circuit 30 operates as a constant-current source as described earlier, so the load curve L in this region is flat, and a sufficiently small Low output potential Vl can be obtained even if the transistor gain coefficient $\beta$ of the EFET 42 is comparatively small. If the input signal Vin next goes Low, the operating point shifts to either the intersection Pha of the load curve L and the characteristic curve Ch or the intersection Ph of the load curve L and the characteristic curve Cd, whichever is at the lower potential. As noted earlier, the DFET 32 in the load circuit 30 then reduces the conductance of the load circuit 30 to an extremely low level, permitting only a small load current I to flow through the load circuit. Accordingly, even if substantially all of this load current flows as a clamp current Icr through the next-stage parasitic diode 43, which then operates at the point of intersection Ph, the clamp current Icr is quite small. As a result, little power will be needlessly dissipated by the clamp current Icr and the inflow of clamp current Icr will raise the Low potential level in the next stage only slightly, so the logic operation will be more stable than in the prior art.

The flow of current through the parasitic diode 43 can be further reduced by designing the circuit so that |Vtd| < Vf. The point Pha will then be disposed to the left of the point Ph so in the High output state the circuit will operate at the point Pha. Since Vh < |Vtd| and in this case |Vtd| < Vf, the parasitic diode 43 will not turn on and current flow through it will be substantially nil.

Figure 7:
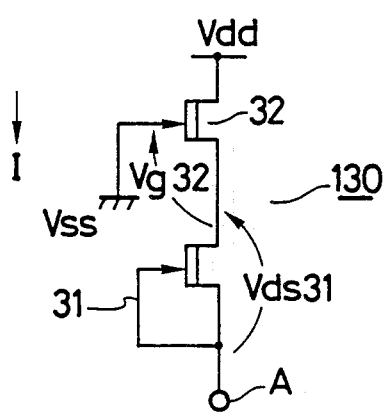
FIG. 7 is a schematic diagram of an FET load circuit illustrating another embodiment of the present invention.

FIG. 7 is a schematic diagram of a novel FET load circuit illustrating a second embodiment of the present invention. This second embodiment differs from the first embodiment in that the pair of load DFETs 31 and 32 are connected in the reverse order. Specifically, the drain of the DFET 32 is connected to the supply voltage Vdd, its gate is connected to the ground potential Vss and its source is connected to the drain of the DFET 31. The source and gate of the DFET 31 are connected to each other, and to a node A to which a driving circuit can also be connected. The gain coefficient $\beta$ of the DFET 31 is less than that of the DFET 32, and the threshold voltage Vtd of the DFETs 31 and 32 is substantially equal in absolute value to Vdd. The drain-source voltage of the DFET 31 shown in FIG. 7 is denoted Vds: the gate-source voltage of the DFET 32 is denoted Vg.

Figure 8:
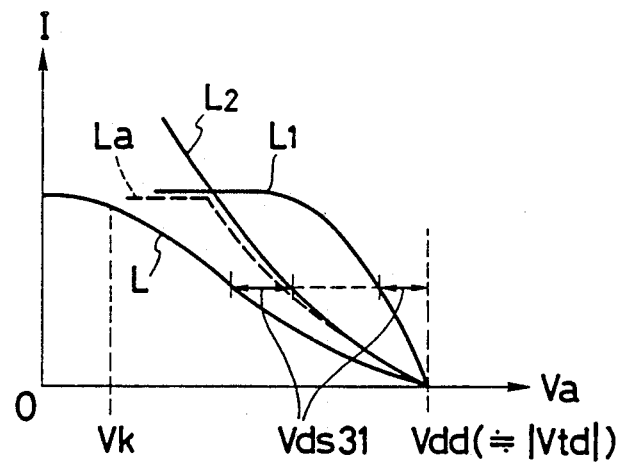
FIG. 8 is a graph illustrating the operating characteristics of the circuit shown in FIG. 7.

FIG. 8 is a load characteristic graph showing the relationship between the potential Va at the node A in FIG. 7 and the load current I. The curve L1 is the load curve of the DFET 31. The curve L2 is the load curve of the DFET 32. The curve La is a composite of the curves L1 and L2. The curve L is the load curve of the entire circuit.

The load curve L of the load circuit 130 shown in FIG. 7, like that of the load circuit 30 shown in FIG. 3, is basically limited by the smaller of the two curves L1 and L2, but there is a difference in that the gate-source voltage Vg of the DFET 32 is the negative of the sum of the potential Va of the node A and the drain-source voltage Vds of the DFET 31: $Vg = -(Va+Vds)$. That is, the gate-source voltage of the DFET 32 is further reduced by the voltage drop Vds across the DFET 31. The overall load curve L shown in FIG. 8 is thus shifted from the curve La defined by the curves L1 and L2 to the left by the amount Vds. With this load characteristic, as in the first embodiment there is a fixed potential Vk at which the conductance of the load circuit rapidly decreases. The clamp current Icr can be reduced to substantially half that of a prior-art DCFL circuit by selecting circuit constants that cause the curves L1 and L2 to intersect at the High logic level of the output signal Vout in, for example the logic circuit shown in FIG. 5.

A load circuit according to this invention possesses superior characteristics not only when used as the load of a logic circuit but also when used as for example, the bit-line load of a memory circuit FIG. 0 shows a schematic diagram of part of one column in a random-access memory (RAM) circuit employing the novel load circuit 30 shown in FIG. 3.

This memory circuit comprises a word line Wi, a pair of complementary bit lines d and $\bar{d}$, a pair of complementary read data lines RD and $\overline{RD}$. a pair of complementary write data lines WD and $\overline{WD}$, a read column address line RA. and a write column address line WA. The complementary bit lines d and $\bar{d}$ are connected to a pair of load circuits 30-1 and 30-2 which are identical to the load circuit 30 shown in FIG. 3, each comprising a pair of DFETs 31 and 32 connected in series. The threshold voltage Vtd of the DFETs 31 and 32 is substantially equal in absolute value to Vf, the forward voltage of the parasitic diodes in the circuit. The pair of complementary bit lines d and $\bar{d}$ are connected to a plurality of six-element memory cells, each of which is also connected to a word line: only the i-th word line Wi and its connected memory cell are shown in the drawing. In addition, the pair of complementary bit lines d and $\bar{d}$ and the pair of complementary read data lines RD and $\overline{RD}$ are connected to a column sense amplifier 60, the pair of complementary bit lines d and $\bar{d}$ and the pair of complementary write data lines WD and $\overline{WD}$ are connected to a write data column switch 70, and the pair of complementary write data lines WD and $\overline{WD}$ are connected to a write data driving circuit 80.

The memory cell 50 comprises a data memory flip-flop circuit consisting of the EFETs 51 and 52 and the DFETs 53 and 54, and a pair of gating EFETs 55 and 56 for gating the operations of storing data in the flip-flop or reading the data stored in the flip-flop. The column sense amplifier 60 comprises a pair of EFETs 61 and 62 having a common source electrode. The gates of the EFETs 61 and 62 are connected to the complementary bit lines d and $\bar{d}$: their drains are connected to the pair of complementary read data lines RD and $\overline{RD}$. The column sense amplifier 60 also comprises an EFET 63 connected in series between the common source of the EFETs 61 and 62 and the ground Vss. The gate of the EFET 63 is connected to the read address line RA. When the read address line RA is active the column sense amplifier 60 inverts and amplifies the signals on the pair of complementary bit lines d and $\bar{d}$ and places the inverted and amplified signals on the pair of complementary read data lines RD and $\overline{RD}$. The write data column switch 70 comprises a pair of gating EFETs 71 and 72 that electrically interconnect the pair of complementary bit lines d and $\bar{d}$ to the pair of complementary write data lines WD and $\overline{WD}$ when the write column address line WA is active. The write data driving circuit 80 comprises EFETs 81, 82, and 83 and DFETs 84, 85, 86 that drive the pair of complementary write data lines WD and $\overline{WD}$ according to a write data signal DAin received as an input.

Figure 9:
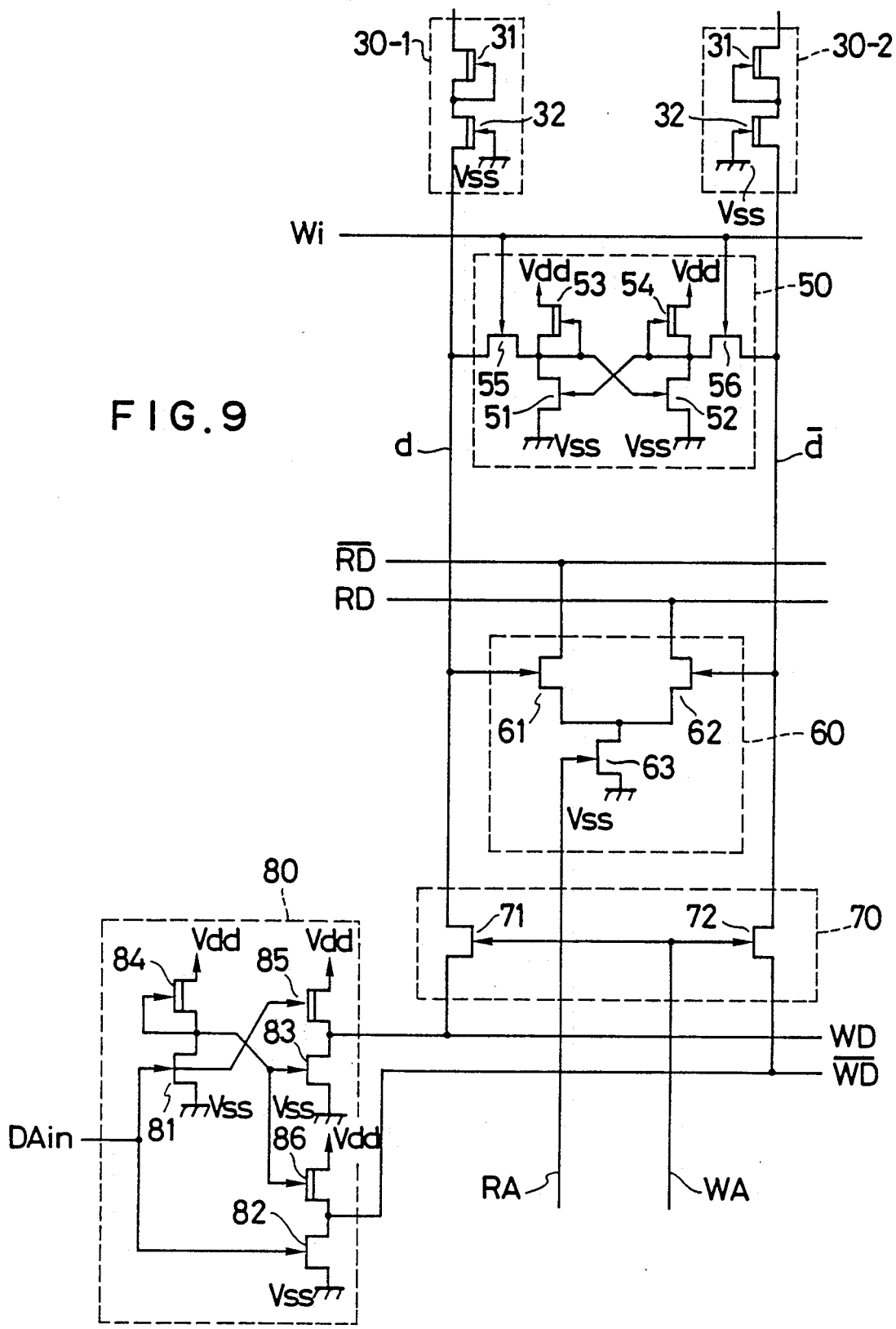
FIG. 9 is a schematic diagram of a memory circuit incorporating the FET load circuit shown in FIG. 3.
Figure 10:
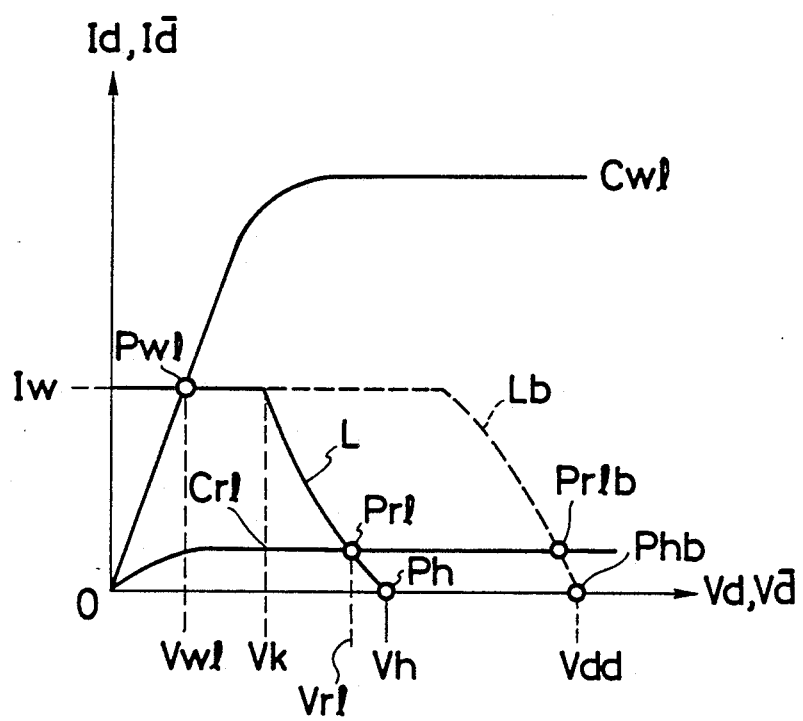
FIG. 10 is a graph illustrating the operating characteristics of the circuit shown in FIG. 9.

FIG. 10 is a graph of the operating characteristics of the complementary bit lines d and $\bar{d}$ shown in FIG. 9. The horizontal axis represents the voltages Vd and $\overline{Vd}$ of these bit lines: the vertical axis represents the currents Id and $\overline{Id}$ on these bit lines. The curve L shown in FIG. 10 is the load curve of the load circuits 30-1 and 30-2. The dashed line Lb, which is shown for comparison, is the load curve of a prior-art load circuit consisting of a single DFET with interconnected source and gate electrodes. The curve Cwl is a write characteristic curve showing the relationship between the voltages Vd and $\overline{Vd}$ of the complementary bit lines d and $\bar{d}$ and the current flowing between the bit line at the Low logic level and the ground Vss of the write data driving circuit 80. The curve Crl is a read characteristic curve showing the relationship between the voltages Vd and $\overline{Vd}$ of the pair of complementary bit lines d and $\bar{d}$ and the current flowing between the bit line at the Low logic level and the ground Vss of the memory cell 50. A read characteristic curve showing the relationship between the voltages Vd and $\overline{Vd}$ of the pair of complementary bit lines d and $\bar{d}$ and the current flowing between the bit line at the High logic level and the ground Vss of the memory cell 50 is on the axis Vd and $\overline{V}$.

The operation of the circuit shown in FIG. 9 will first be described for the bit line d or $\bar{d}$ that is at the High logic level.

In a read or write operation, current flows from the supply voltage Vdd to the bit line d or $\bar{d}$ at the High logic level via three routes: through the load circuits 30-1 and 30-2, through the memory cell 50, and from the write data driving circuit 80 through the write data column switch 70. The latter two of these routes are gated by the EFETs 55, 56, 71, and 72; when the bit line voltage Vd or $\overline{Vd}$ is equal to the potential of the word line Wi and the write column address line WA. current flow via these routes is stopped. The word line Wi is clamped by the parasitic diodes in the gating EFETs 55 and 56 connected to the bit line d and $\bar{d}$ one of which is at the Low logic level (about 0.1 to 0.2V), so the potential of these lines cannot exceed a potential Vf+Vl (potential of the source of one of the FETs 55 and 56) which is substantially equal to Vf. Similarly the write column address line WA is clamped by the parasitic diodes in the gating EFETs 71 and 72 connected to the bit line d and $\bar{d}$ one of which is at the Low logic level (about 0.1 to 0.2V), so the potential of these lines cannot exceed a potential Vf+Vl (potential of the source of one of the FETs 71 and 72) which is substantially equal to Vf. Consequently when the potential of the High bit line d or $\bar{d}$ exceeds Vf, current flows from Vdd toward that bit line only through the load circuits 30-1 and 30-2. As explained earlier, the conductance of the load circuit 30 shown in FIG. 3 drops abruptly when the potential of the node A exceeds $|Vtd|$, which is substantially equal to Vf, so the High logic level Vh on the bit line d or $\bar{d}$ is substantially equal to $|Vtd|$ (or Vf); hence the operating point of the circuit is Ph as shown in FIG. 10. $|Vtd|$ can be made substantially equal to Vf by adjustment of the dosage and the energy with which the impurity is ion-implanted during fabrication of the DFETs. With a prior-art load circuit comprising only a single DFET with interconnected gate and source electrodes, current would flow until the potential of the bit line d or $\bar{d}$ reached the supply voltage Vdd, so the operating point would be Phb as shown in FIG. 10 and the High logic level would be substantially equal to Vdd.

Next the operation of the bit lines d and $\bar{d}$ at the Low logic level will be described.

The operating point of the Low bit line d or $\bar{d}$ in a write operation is the point of intersection Pwl of the write characteristic curve Cwl and the load curve L. The potential at this point is the Low write bit line potential Vwl; the current is the write bit line current Iw. In a read operation, the operating point is the point of intersection Prl of the read characteristic curve Crl and the load curve L. The potential at this point is the Low read bit line potential Vrl. From the viewpoint of power dissipation, a small write bit line current Iw is desirable, and from the viewpoint of write margin the write bit line potential Vwl must be low. In order for data to be readable quickly, and to prevent a write malfunction that would occur if the residual charge left by a read operation on the bit line caused the data in the next selected memory cell to invert, the logic swing on the bit line in a read operation must be small and must take place in the region above the Low write bit line potential Vwl.

As explained previously, when the bit line potential is low, the DFET 31 in the corresponding load circuit 30-1 or 30-2 becomes a constant-current source causing the curve L to flatten out, thus reducing the transistor gain coefficient $\beta$ and enabling a small Iw and a sufficiently low Vwl to be obtained. When the potential Vd or $V\bar{d}$ of the bit line d or $\bar{d}$ exceeds the fixed value Vk, however, the conductance of the load circuit 30-1 or 30-2 is rapidly reduced by the DFET 32, so the curve L slopes downward. If the curve L has a steep slope, which can be obtained by designing the DFETs 32 to have a large $\beta$, then the operating points Prl and Ph will be in close proximity to each other, and it will not be difficult to place them in the potential region above Vwl while giving the bit lines a small read logic swing. With the prior-art load circuit having the load characteristic Lb the operating point for the write operation is the same Pwl as in this embodiment of the invention, but the read operating point is the intersection Prlb of the curve Lb with the read characteristic curve Crl.

A comparison of the characteristics shown in FIG. 10 shows that both the novel load circuits 30-1 and 30-2 and the prior-art load circuit can provide the necessary small Iw, low Vwl, and small logic swing on the bit lines in a read operation. In the prior art, however, the potentials Vd and $V\bar{d}$ of the bit lines in a read operation are close to the supply voltage Vdd, whereas with the novel load circuits 30-1 and 30-2 the potentials Vd and $V\bar{d}$ of the bit lines in a read operation take on values in the vicinity of $|Vtd|$ (which is substantially equal to Vf), placing them higher than Vwl but well below Vdd, thus reducing power dissipation. A further advantage is that $|Vtd|$ is independent of Vdd so the read operation is stabilized by elimination of the danger that a rise in the supply voltage Vdd will cause the pair of complementary bit lines d and $\bar{d}$ to be clamped by the parasitic diodes of the EFETs 61 and 62 in the column sense amplifier 60 to which the bit lines d and $\bar{d}$ are connected, a danger that exists in the prior art. Yet another advantage of the novel load circuit is that the word lines Wi can be driven by logic circuits like the one in FIG. 5 including the load circuit 30 in FIG. 3, thereby suppressing the clamp current flowing to the memory cell 50, thus improving its bistability.

The scope of this invention is not limited to the embodiments described above, but includes many modifications and variations that will be obvious to one skilled in the art. In particular, although the field-effect transistors in these embodiments were MESFETs in a GaAs integrated circuit, other types of transistors can also be used, such as MESFETs in a silicon integrated circuit, or PN junction-type field effect transistors. The load circuits 30 and 130 in the preceding embodiments can also be applied to circuits other than logic and memory circuits.

What is claimed is:

1. A field-effect transistor load circuit for use in an electronic circuit having a supply voltage terminal, a ground terminal, and a drive node for connection to a driving circuit, said field-effect transistor load circuit comprising:
   a first field-effect transistor of a normally-on type having gate and source electrodes coupled together; and
   a second field-effect transistor of a normally-on type having a gate electrode connected to the ground terminal;
   wherein said first field-effect transistor and said second field-effect transistor are connected in series between the supply voltage terminal and the drive node; and
   wherein a transistor gain coefficient of said first field-effect transistor is less than a transistor gain coefficient of said second field-effect transistor.

2. A circuit according to claim 1, wherein said drive node has a potential midway between a potential on said supply voltage terminal and a potential on said ground terminal.

3. A circuit according to claim 1, wherein the driving circuit is connected between said drive node and said ground terminal.

4. A circuit according to claim 1, wherein a threshold voltage of said first field-effect transistor and said second field-effect transistor has a smaller absolute value than the supply voltage.

5. A circuit according to claim 4, wherein said first field-effect transistor and said second field-effect transistor are metal semiconductor field-effect transistors.

6. A circuit according to claim 5, wherein said first field effect transistor and said second field-effect transistor are fabricated on a compound semiconductor substrate.

7. A circuit according to claim 4, wherein said first field-effect transistor and said second field-effect transistor are PN junction-type field-effect transistors.

8. A circuit according to claim 7, wherein said first field-effect transistor and said second field-effect transistor are fabricated on a compound semiconductor substrate.

9. A circuit according to claim 1, wherein said first field-effect transistor has a drain electrode connected to the supply voltage terminal, and said second field-effect transistor has a drain electrode connected said source electrode of said first field-effect transistor, and has a source electrode connected to the drive node.

10. A circuit according to claim 1, wherein said second field-effect transistor has a drain electrode connected to the supply voltage terminal, and said first field-effect transistor has a drain electrode connected to a source electrode of said second field-effect transistor, and has its source electrode connected to the drive node.

11. A field-effect transistor circuit comprising:
a supply voltage terminal;
a ground terminal;
a drive node;
a low-potential terminal having a potential lower than a potential at said drive node;
a first field-effect transistor of a normally-on type having gate and source electrodes coupled together;
a second field-effect transistor of a normally-on type having a gate electrode connected to said ground terminal;
said first field-effect transistor and said second field-effect transistor being connected in series between said supply voltage terminal and said drive node;
a transistor gain coefficient of said first field-effect transistor being less than a transistor gain coefficient of said second field-effect transistor; and
a switching element, connected between said drive node and said low-potential terminal, for being turned on and off according to a received logic signal.

12. A circuit according to claim 11, wherein said low-potential terminal is the ground terminal.

* * * * *